United States Patent [19]
Huang et al.

[11] Patent Number: 5,920,093
[45] Date of Patent: Jul. 6, 1999

[54] SOI FET HAVING GATE SUB-REGIONS CONFORMING TO T-SHAPE

[75] Inventors: Wen Ling Margaret Huang, Phoenix, Ariz.; Ying-Che Tseng, Los Angeles, Calif.

[73] Assignee: Motorola, Inc., Schaumburg, Ill.

[21] Appl. No.: 08/834,964

[22] Filed: Apr. 7, 1997

[51] Int. Cl.⁶ ................................................ H01L 27/12
[52] U.S. Cl. ..................... 257/347; 257/344; 257/348; 257/349; 257/354; 257/507
[58] Field of Search .................... 257/347–354, 257/507, 344

[56] References Cited

U.S. PATENT DOCUMENTS

| | | | |
|---|---|---|---|
| 5,001,528 | 3/1991 | Bahraman | 387/23.7 |
| 5,604,360 | 2/1997 | Zhang et al. | 257/347 |
| 5,656,844 | 8/1997 | Klein et al. | 257/347 |

*Primary Examiner*—Fetsum Abraham
*Attorney, Agent, or Firm*—Kenneth M. Seddon

[57] ABSTRACT

A semiconductor device (120) is formed in a silicon-on-insulator (SOI) substrate (135). The semiconductor device (120) has a channel region (126) that is controlled by a gate structure (129). The channel region (126) has a doping profile that is essentially uniform where the channel region (126) is under the gate structure (129). This eliminates the parasitic channel region that is common with conventional field effect transistors (FETs) that are formed in SOI substrates. Consequently, the semiconductor device (120) of the present invention does not suffer from the "kink" problem that is common to conventional FET devices.

17 Claims, 5 Drawing Sheets

10

110

120

120

120

170

180

190

SOI FET HAVING GATE SUB-REGIONS CONFORMING TO T-SHAPE

BACKGROUND OF THE INVENTION

The present invention relates, in general, to semiconductor devices, and more particularly, to semiconductor devices that have non-linear parasitic affects.

FIG. 1 is a graph 10 illustrating the performance of a conventional body-tied, partially depleted field effect transistor (FET) that is formed in a silicon-on-insulator (SOI) substrate. A line 11 is used to represent the amount of current in amps (A), indicated by a y-axis 14, that the FET produces as the voltage potential on the gate of the FET ($V_g$) is varied. The voltage potential is indicated in graph 10 along an x-axis 15 in volts.

One problem that is common to conventional body-tied FETs formed in SOI substrates is the presence of a "kink" region in the output performance of the FET. This "kink" region is indicated in graph 10 with a bracket 13. The "kink" region occurs as a FET device transitions from a non-conductive state to a conductive state during operation. This transition is also indicated in graph 10 by a bracket 12.

Up to now, the exact cause of the "kink" problem in body-tied FETs formed in SOI substrates has not been identified. However, the impact of "kink" affect on the performance of FETs formed in SOI substrates is significant. The "kink" problem reduces the breakdown voltage, creates anomalous subthreshold characteristics, affects the linearity of the device, and results in high leakage current and increased power consumption.

Accordingly, a need exists to first identify the cause of the "kink" problem associated with conventional body-tied FETs formed in SOI substrates and then to provide a FET in an SOI substrate that does not suffer from the "kink" effect problem.

Figure 1:
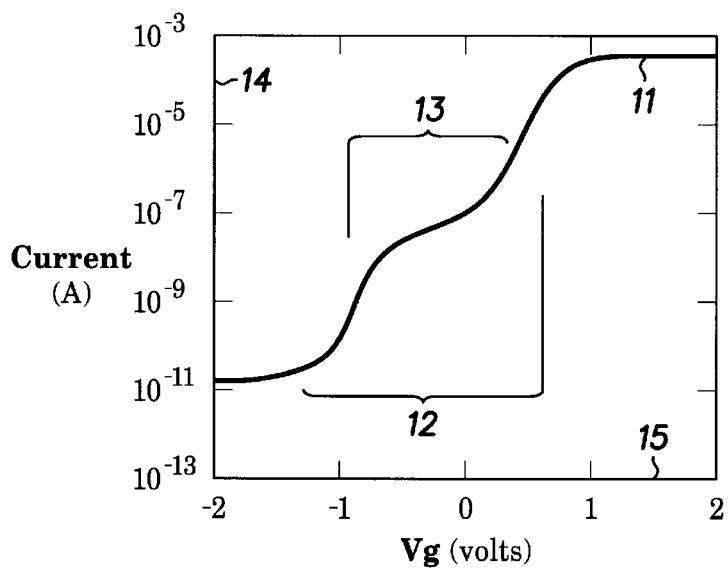
FIG. 1 is a graph illustrating the performance of a conventional body-tied FET device in an SOI substrate.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

FIGS. 2–6 are enlarged top views of the steps that are used to form a conventional body-tied FET 20 (FET 20) in an SOI substrate. FIGS. 2–6 are provided to illustrate the problem in the manufacturing process of conventional body-tied FETs that results in the "kink" effect in their output performance. In the example that follows, FET 20 is described in an n-channel configuration. It should be understood that the "kink" problem applies to a p-channel device as well, and a p-channel device is formed by making n-type regions p-type regions and vice versa.

Figure 2:
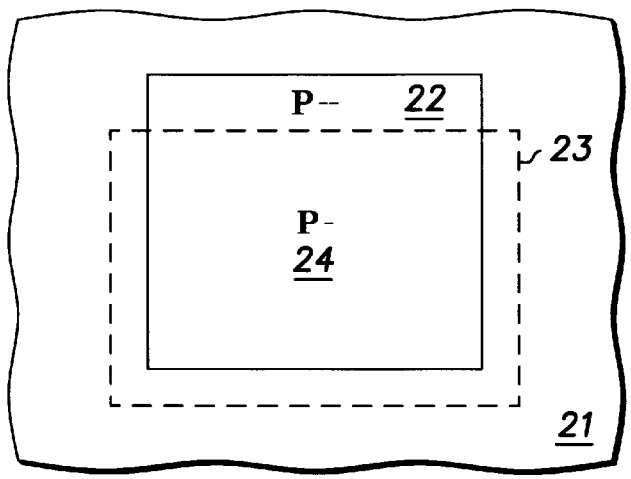
FIGS. 2–5 are enlarged top views of a body-tied, T-gate FET at various states of a conventional manufacturing process.

Referring to FIG. 2, the process of forming FET 20 begins by providing an SOI substrate 35 that has an active area 22, which is insulated and surrounded by a field oxide region 21. Active area 22 is the portion of an SOI substrate that is semi-conducting and is where the electrically active portions of FET 20 are formed. Typically, active area 22 is lightly doped as a consequence of the process that is commonly used to form SOI substrates. Accordingly, the symbol 'P−−' is shown in FIG. 2 to indicate the light doping nature of active area 22.

A threshold adjust implant process is used to enhance the electrical properties of FET 20. This step involves forming an implant mask on the SOI substrate so only the portions of active area 22 to be implanted remain exposed through the mask. As is well known in the art, the implant mask is formed by patterning a layer of photosensitive material (i.e. photoresist) using a reticle. The cost of a reticle is quite significant, and where ever possible, the same reticle is used in several different processing steps. Such is the case with the formation of conventional FETs.

A dashed line 23 is used in FIG. 2 to indicate the portion of active area 22 that is implanted to provide the threshold adjust implant. As will be explained in more detail below, the reticle that is used to define the threshold adjust implant (dashed line 23) is subsequently used to form source and drain regions in FET 20. After the threshold adjust implant, a portion 24 of active area 22 has a higher doping concentration as indicated in FIG. 2 with the symbol "P−". One skilled in the art can determine the exact doping concentration which will depend on several factors such as the desired threshold voltage.

Figure 3:
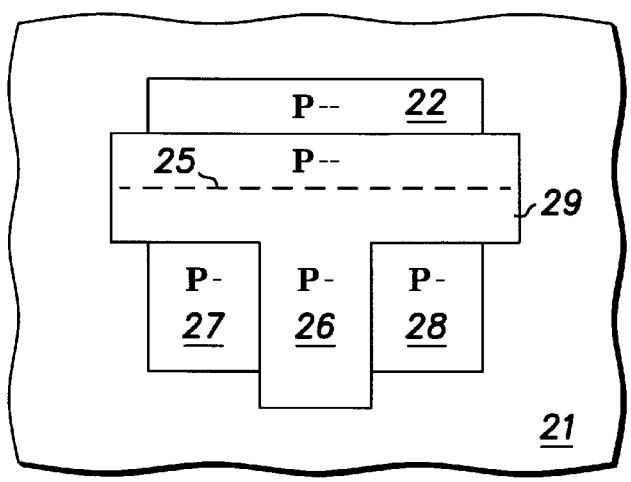

Turning now to FIG. 3, a gate structure 29 is formed over active area 22 using conventional techniques. Gate structure 29 is used to partition active area 22 into a source region 27 and a drain region 28. A portion of gate structure 29 is also used to control a channel region 26 that is under a portion of gate structure 29 and between source region 27 and drain region 28. A dashed line 25 is used to indicate which portions of active area 22 under gate structure 29 have a P−− doping concentration or a P− doping concentration as a result of the implantation process described above.

Figure 4:
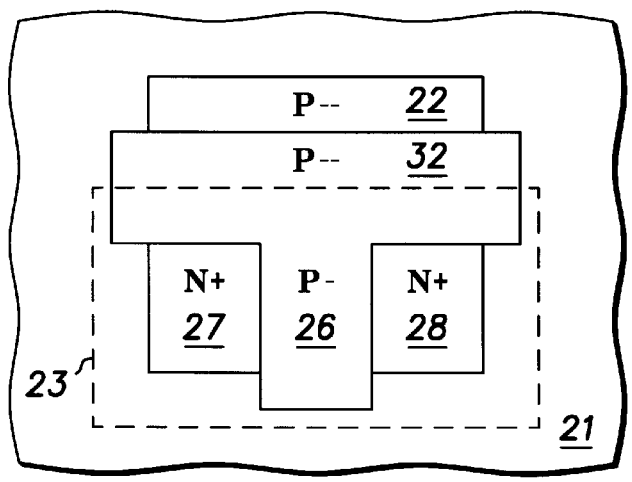

As shown in FIG. 4, source region 27 and drain region 28 are formed by doping portions of active area 22 so that they are heavily n-type (indicated in FIG. 4 with the symbol "N+"). To form source region 27 and drain region 28, another implant mask is formed over active area 22. The same reticle used to define the implant mask for the threshold adjust implant (see FIG. 2) is used again to define the portions of active area 22 that are doped to an N+ conductivity. The portion of FET 20 that is doped with an n-type dopant is shown in FIG. 4 with a dashed line 23 (same as FIG. 2).

Because the same reticle is used to define both the threshold adjust implant (see FIG. 2) and the source/drain implant as shown in FIG. 4, there is a portion 32 of active area 22 under gate structure 29 that has a very light doping concentration. This portion 32 of active area 22 is indicated in FIG. 4 to be "P--". As will be explained in more detail below, it has been discovered that the "kink" problem of FET 20 is a direct result of the presence of this P-- portion 32 in active area 22.

Figure 5:
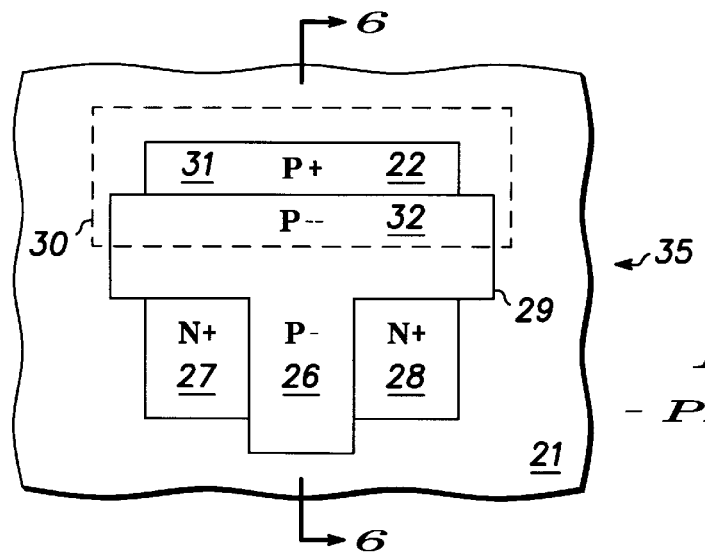

The manufacture of FET 20 continues as indicated in FIG. 5. A channel contact region 31 is formed in active area 22 to provide a way of electrically connecting to channel region 26. Another implant mask is formed over active area 22 using an entirely different reticle from the one that is used to define the threshold adjust implant. The portion of FET 20 that is implanted to form channel contact region 31 is shown in FIG. 5 as a dashed line 30. A p-type dopant is implanted into the exposed portion of FET 20 to dope channel contact region 31 so that it has a P+ doping concentration. For example, a relatively heavy dose of about $3 \times 10^{15}$ atoms/centimeter$^2$ (cm$^2$) to $6 \times 10^{15}$ atoms/cm$^2$ at a relatively low energy of about 10 keV to 50 keV can be used.

Figure 6:
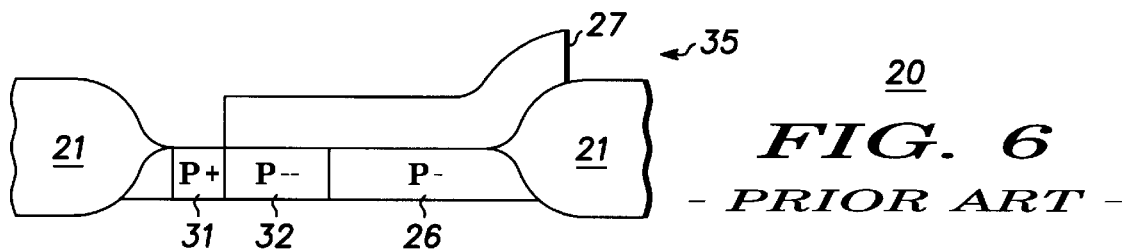
FIG. 6 is an enlarged cross-sectional view of the conventional body-tied FET device formed from the process illustrated in FIGS. 2–5.

FIG. 6 is an enlarged cross-sectional view of body-tied FET 20 upon completion of the manufacturing process described above. The cross-section shown in FIG. 6 is indicated in FIG. 5 with sectional lines 6—6. As mentioned above, gate structure 29 is used to modulate channel region 26 (see FIG. 5) to control a current flow between source region 27 and drain region 28. However, as a consequence of using the same reticle to define both the threshold adjust implant and the source/drain implant, the doping concentration under gate structure 29 is not uniform.

As indicated in FIG. 6, there are two distinct regions under gate structure 29 that have different doping concentration levels. Although a channel region 26 represents a majority of active area 22 under gate structure 29, there is still a portion 32 of active area 22 under gate structure 29 that is only doped to a P-- concentration level. It has been discovered that this lightly doped region (portion 32) under gate structure 29 is the cause of the "kink" problem (see FIG. 1, bracket 13) of conventional field effect transistors formed in SOI substrates.

The portion 32 of active area 22 has a P-- concentration level that is typically $1 \times 10^{15}$ atoms/cm$^3$ or less. This is significantly less than the P- channel region 26 that typically as a doping concentration on the order of about $1 \times 10^{17}$ atoms/cm$^3$. Consequently, as the voltage potential on gate structure 29 is increased, (see FIG. 1, bracket 12) portion 32 is the first to conduct between source region 27 and drain region 28 because this region conducts at a lower threshold voltage potential than channel region 26 due to the lower doping concentration in this portion 32 of active area 22. This results in the "kink" region indicated in FIG. 1 with bracket 13.

Figure 7:
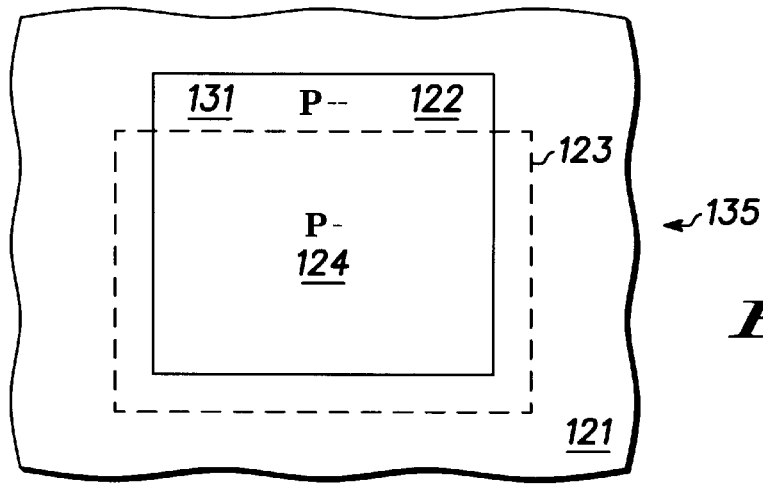

Now that the source of the "kink" region has been identified, a method is provided that forms a field effect transistor that has an essentially constant doping concentration across its channel region, and thus, does not suffer from the "kink" problem of conventional FETs. The method begins as shown in FIG. 7. FIG. 7 is an enlarged top view of a semiconductor device 120 at an early stage in the manufacturing process. Semiconductor device 120 is preferably formed in an SOI substrate 135, but it should be understood that the present invention may have application to devices formed in other semiconductor substrates such as a silicon substrate or a compound semiconductor substrate.

Semiconductor device 120 is formed in an active area 122 that is insulated by a field oxide region 121. Preferably, active area 122 is lightly doped, P--, and has a doping concentration less than about $1 \times 10^{16}$ atoms/cm$^3$. At least a portion of active area 122 is doped with a p-type dopant such a boron to enhance the electrical characteristics of semiconductor device 120. To do this, a photolithographic process is used to form an implant mask that exposes a portion of active area 122. The portion of active area 122 that is exposed is indicted in FIG. 7 with a dashed line 123. This pattern is defined by exposing a photosensitive material to light through a reticle.

A conventional implant process is then used to doped at least a portion 124 of active area 122 so that it has a doping concentration of less than about $1 \times 10^{19}$ atoms/cm$^3$ and greater than about $1 \times 10^{16}$ atoms/cm$^3$. This portion 124 of active area 122 is indicated in FIG. 7 with the symbol "P-". It should also be understood that it is may be desirable to implant all of active area 122 with a threshold adjust implant, in which case, dashed line 123 would border or be outside active area 122.

Figure 8:
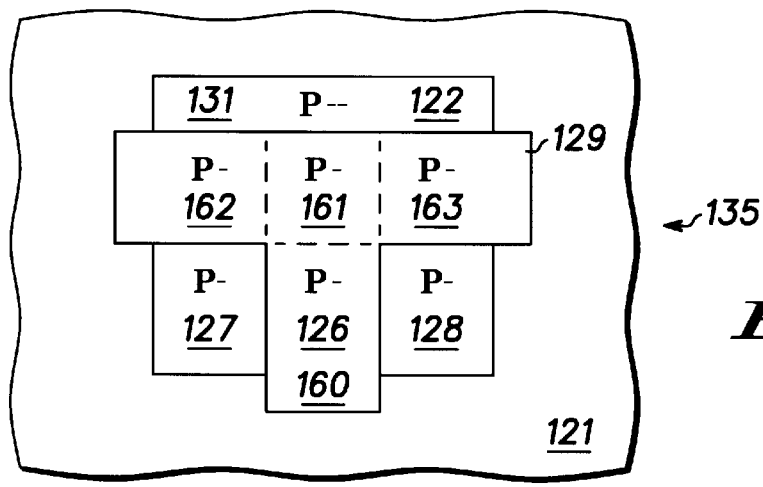

As shown in FIG. 8, the method of forming semiconductor device 120 continues by forming a gate structure 129 over portions of active area 122. For purposes of illustration, gate structure 129 is partitioned with dashed lines into sub-regions 160–163 to explain the relative purpose of each section of gate structure 129 and how gate structure 129 effective divides active area 122, For example, sub-regions 160 and 161 are used to modulate a channel region 126 in active area 122 that is between a source region 127 and a drain region 128. Sub-regions 162 and 163 are used to physically isolate a portion of active area 122 that will be a channel contact region 131 from source region 127 and drain region 128, respectively. If desired, it should also be understood that it is possible to perform the threshold adjust implant step shown in FIG. 7 after the formation of gate structure 129.

Figure 9:
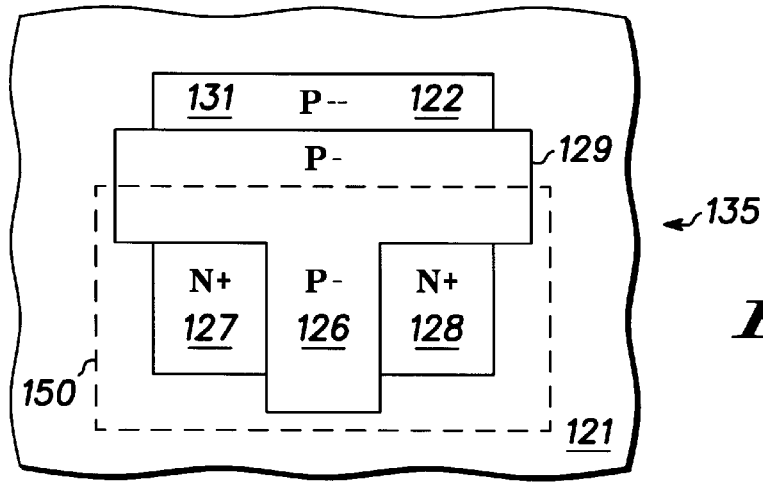

Turning now to FIG. 9, the formation of semiconductor device 120 continues with the doping of source region 127 and drain region 128 with an n-type dopant such as phosphorus. This doping process involves the formation of an implant mask to select the portions of active area 122 that are to be doped with the n-type dopant. Another reticle is used in combination with a photolithographic process to provide the implant mask. The portion of active area 122 to be implanted is indicated in FIG. 9 with a dashed line 150. The reticle used to define this pattern (dashed line 150) is different than the reticle used to define portion 124 of FIG. 7 (dashed line 123).

Figure 10:
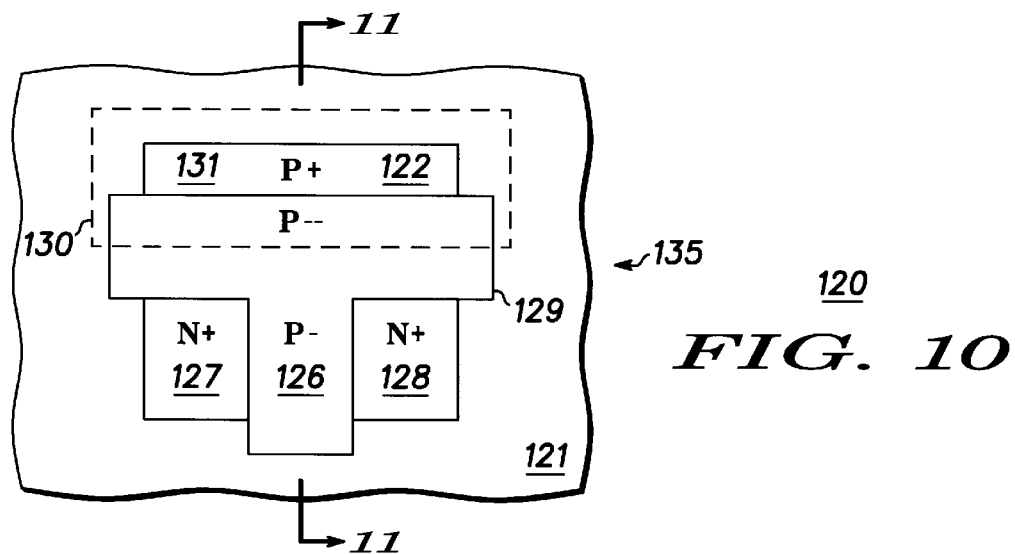
FIGS. 7–10 are enlarged top views of a semiconductor device at various states of a manufacturing process in accordance with the present invention.

The process of forming semiconductor device 120 in accordance with the present invention continues as shown in FIG. 10. The portion of active area 122 that provides channel contact region 131 is doped with a p-type dopant such as boron using an implant process. Another reticle is used in combination with a photolithographic process to define an implant mask as indicated in FIG. 10 with a dashed line 130. A conventional implant process is used to dope channel contact region 131 so that it preferably has a P+ doping concentration that is equal to or greater than about $1 \times 10^{19}$ atoms/cm$^3$.

Semiconductor device 120 is operated by placing a voltage potential on gate structure 129, thereby allowing a current to flow from source region 127 to drain region 128. In this example, semiconductor device 120 is formed in an SOI substrate. As a result, holes due to the current flow may collect in channel region 126. Channel contact region 131 is used to place a voltage potential on or near channel region 126 to remove holes that collect in channel region 126 when semiconductor device 120 is in operation.

Figure 11:
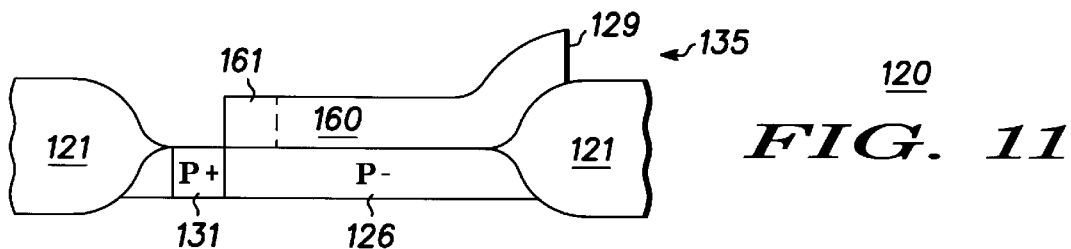
FIG. 11 is an enlarged cross-sectional view of the semiconductor device formed from the process illustrated in FIGS. 7–10 in accordance with the present invention.

FIG. 11 is an enlarged cross-sectional view of semiconductor device 120 after completion of the steps shown in FIGS. 7–10. The cross-section shown in FIG. 11 is taken along sectional lines 11—11 shown in FIG. 10. As a result of the process described above, sub-regions 160 and 161 (see FIG. 8) overlie channel region 126, which has an essentially constant doping concentration in all portions of channel region 126 that are under gate structure 129. This profile results from the fact that the entire channel region 126 is doped to a P– concentration level. Of course, the doping concentration across channel region 126 is not exactly constant as slight variations due to non-uniform diffusion of dopant are expected by one skilled in the art.

Figure 12:
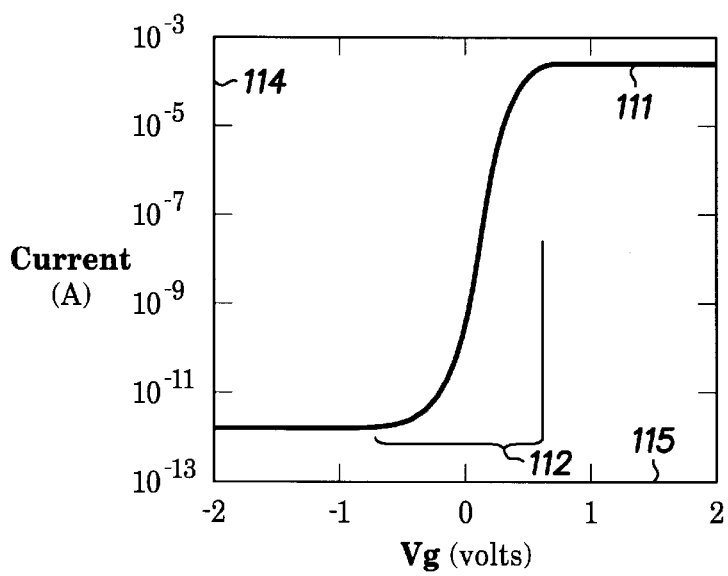
FIG. 12 is a graph illustrating the performance of a semiconductor device manufactured in accordance with the present invention.

The structure of the present invention differs from conventional FETs in that the lightly doped portion 32 (see FIG. 6) common to conventional FETs has been eliminated. As a result, semiconductor device 120 transitions from a non-conductive to a conductive state in a more uniform manner and without the parasitic affects of a "kink" region. This improvement is illustrated in graph 110 of FIG. 12. Graph 110 represents the output of a semiconductor device formed in accordance with the present invention. A y-axis 114 is used to show the output current of the semiconductor device in amps (A) as the gate voltage, $V_g$, is varied along an x-axis 115. Line 111 represents the output of the semiconductor device, and as shown, is devoid of the "kink" region (see FIG. 1, bracket 13) that is common to conventional FETs formed in SOI substrates.

It should also be noted that the transition region from a non-conductive state to a conductive state of the semiconductor device is also significantly narrower. The transition region is indicated in graph 110 with a bracket 112. Consequently, a semiconductor device formed in accordance with the present invention is more linear and more tolerant to noise. As shown in graph 110, the output current of the semiconductor device increases monotonically during the transition from a non-conductive to a conductive state (bracket 112).

Additionally, the removal of the parasitic channel region that occurs in conventional devices results in a device that has less leakage current. For example, when a voltage potential of about 0 volts is placed on the gate structure of a semiconductor device that is formed in accordance with the present invention, the output current is on the order of about $1 \times 10^{11}$ A. This is in contrast to a value of about $1 \times 10^{-7}$ A with comparable FET devices formed in SOI substrates using the conventional processing techniques (see FIG. 1).

Figure 13:
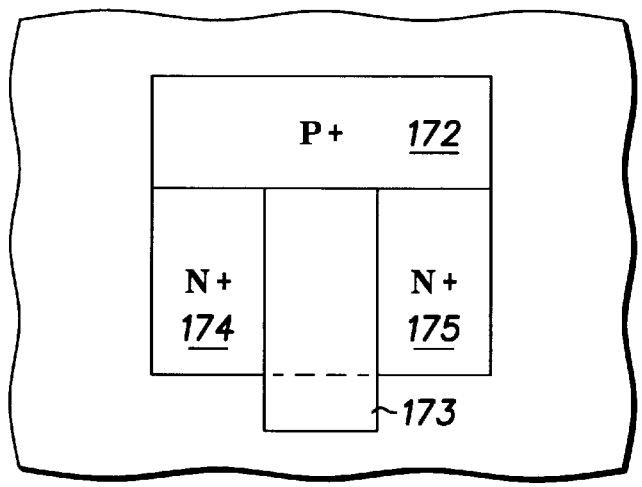
FIGS. 13–15 are enlarged top views of semiconductor devices formed in accordance with alternate embodiments of the present invention.
Figure 14:
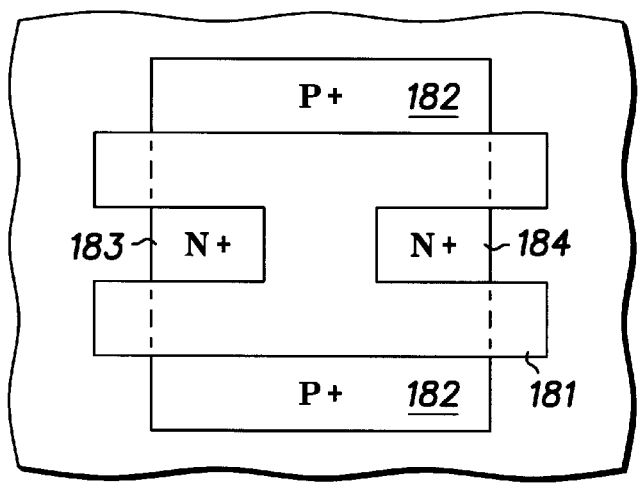
Figure 15:
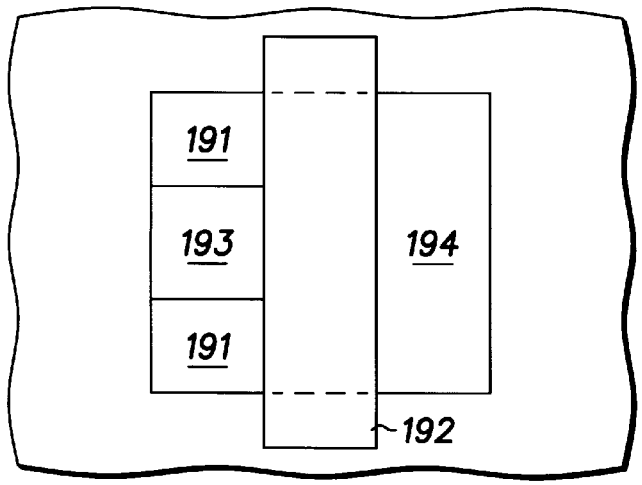

FIGS. 13–15 illustrate enlarged top views of semiconductor devices 170, 180, and 190, respectively, that are formed in accordance with alternate embodiments of the present invention. In particular, semiconductor device 170 in FIG. 13 is formed such that its gate structure 173 is arranged in an "I" configuration instead of the 'T' configuration as shown in FIG. 10. This arrangement may be desirable if semiconductor device 170 is formed without the use of a silicidation process to form electrical connection to a source region 174 and a drain region 175. In this embodiment, a channel contact region 172 is in direct contact with source region 174 and drain region 175. This results in the formation of a PN junction between channel contact region 172 and source region 174 and between channel contact region 172 and drain region 175.

It is also possible to form a semiconductor device 180 as shown in FIG. 14 so that its gate structure 181 is in an 'H' configuration. This may be desirable to enhance the removal of holes through channel contact regions 182 as a current flows from a source region 183 to a drain region 184. The present invention can also be used to form a semiconductor device 190 as shown in FIG. 15 such that channel contact regions 191 are on the same side of a gate structure 192 as a source region 193. Therefore, channel contact regions 191 would be on the opposite side of gate structure 192 as a drain region 194.

The cause of the "kink" problem that plaques conventional FET devices has been discovered. Additionally, the present invention provides a method of forming a semiconductor device that does not have a parasitic channel region and which does not suffer from the "kink" problem.

We claim:

1. A semiconductor device comprising:

a silicon-on-insulator substrate having a surface;

a first doped region extending from the surface of the silicon-on-insulator substrate, wherein the first doped region is of a first conductivity type;

a second doped region of the first conductivity type extending from the surface of the silicon-on-insulator substrate and the second doped region is separated from the first doped region to provide a channel region, wherein the channel region has a doping concentration of a second conductivity type that is substantially constant across the channel region;

a third doped region of the second conductivity type in the silicon-on-insulator substrate, wherein the third doped region extends from the surface of the silicon-on-insulator substrate, is electrically coupled to the channel region, and forms a PN junction with the first doped region and the second doped region; and a gate structure overlying the channel region, wherein the gate structure has a first sub-region, a second sub-region, a third sub-region, and fourth sub-region, the first sub-region overlying the channel region and the second sub-region being between the third sub-region and the fourth sub-region, and wherein the silicon-on-insulator substrate has a doping profile under the second sub-region of the gate structure that is substantially equal to a doping profile under the first sub-region of the gate structure.

2. The semiconductor device of claim 1 wherein the third doped region has a doping concentration, and the doping concentration of the third doped region is greater than or equal to the doping concentration of the channel region.

3. The semiconductor device of claim 2 wherein the doping concentration of the channel region is less than about $1 \times 10^{19}$ atoms/cm$^3$ and greater than about $1 \times 10^{16}$ atoms/cm$^3$.

4. The semiconductor device of claim 3 wherein the doping concentration of the third doped region is greater than about $1 \times 10^{19}$ atoms/cm$^3$.

5. A semiconductor device comprising:

a semiconductor substrate that has an active area;

a gate structure overlying the semiconductor substrate, wherein the gate structure has a first portion, a second portion, a third portion, and a fourth portion, the second portion separating the third portion from the fourth portion;

a first doped region in the semiconductor substrate, wherein the first doped region is of a first conductivity type;

a second doped region of the first conductivity type in the semiconductor substrate, the second doped region being separated from the first doped region to provide a channel region that has a doping concentration, wherein the first portion of the gate structure is overlying the channel region;

a third doped region of a second conductivity type in the semiconductor substrate, wherein the third doped region is electrically coupled to the channel region, the third doped region being separated from the first doped region by the third portion of the gate structure, and the third doped region being separated from the second doped region by the fourth portion of the gate structure; and wherein the active area under the second portion of the gate structure has a doping concentration that is essentially equal to the doping concentration of the channel region under the first portion of the gate structure.

6. The semiconductor device of claim 5 wherein the gate structure is in a 'T' configuration.

7. The semiconductor device of claim 5 wherein the gate structure is in an 'H' configuration.

8. The semiconductor device of claim 5 wherein a first voltage potential on the gate structure results in a current flow from the first doped region to the second doped region.

9. The semiconductor device of claim 8 wherein a second voltage potential on the third doped region results in holes being removed from the channel region.

10. The semiconductor device of claim 5 wherein the second portion of the gate structure is adjacent to the first portion of the gate structure, the third portion of the gate structure, and the fourth portion of the gate structure.

11. The semiconductor device of claim 5 wherein the third doped region has a doping concentration and the doping concentration of the third doped region is greater than or equal to the doping concentration of the channel region.

12. The semiconductor device of claim 5 wherein the third doped region has a doping concentration and the doping concentration of the third doped region is greater than the doping concentration of the channel region.

13. The semiconductor device of claim 12 wherein the doping concentration of the channel region is less than about $1 \times 10^{19}$ atoms/cm$^3$ and greater than about $1 \times 10^{16}$ atoms/cm$^3$.

14. The semiconductor device of claim 13 wherein the doping concentration of the third doped region is greater than about $1—10^{19}$ atoms/cm$^3$.

15. The semiconductor device of claim 5 wherein the semiconductor substrate is a silicon-on-insulator substrate.

16. A semiconductor device comprising:

a silicon-on-insulator substrate that has an active area;

a gate structure overlying the silicon-on-insulator substrate, wherein the gate structure has a first portion, a second portion, a third portion, and a fourth portion, the second portion separating the third portion from the fourth portion;

a first doped region in the silicon-on-insulator substrate, wherein the first doped region is of a first conductivity type;

a second doped region of the first conductivity type in the silicon-on-insulator substrate, the second doped region being separated from the first doped region to provide a channel region;

a third doped region of a second conductivity type in the silicon-on-insulator substrate, wherein the third doped region is coupled to the channel region, the third doped region being separated from the first doped region by the third portion of the gate structure, and the third-doped region being separated from the second doped region by the fourth portion of the gate structure; and wherein a current flow is provided between the first doped region and the second doped region when a voltage potential is placed on the gate structure and the current flow increases monotonically when the voltage potential is increased such that the semiconductor device changes from a non-conductive to a conductive state.

17. The semiconductor device of claim 16 wherein the current flow increases absent a kink region when the semiconductor device changes from the non-conductive to the conductive state.

* * * * *